(12) United States Patent
Rapoport et al.

(10) Patent No.: US 7,068,700 B2
(45) Date of Patent: Jun. 27, 2006

(54) OPTICAL BENCH FOR DIODE-PUMPED SOLID STATE LASERS IN FIELD APPLICATIONS

(75) Inventors: William Ross Rapoport, Bridgewater, NJ (US); Steven Vetorino, Berthoud, CO (US); Geoffrey Wilson, Rogue River, OR (US)

(73) Assignee: Honeywell International Inc., Morristown, NJ (US)

( * ) Notice: Subject to any disclaimer, the term of this patent is extended or adjusted under 35 U.S.C. 154(b) by 309 days.

(21) Appl. No.: 10/714,578

(22) Filed: Nov. 14, 2003

(65) Prior Publication Data

US 2005/0129083 A1    Jun. 16, 2005

(51) Int. Cl.
*H01S 3/083* (2006.01)
(52) U.S. Cl. .......................................... 372/94; 372/93
(58) Field of Classification Search ................ 372/107, 372/104, 98, 92, 22, 94, 93
See application file for complete search history.

(56) References Cited

U.S. PATENT DOCUMENTS

| | | | | |
|---|---|---|---|---|
| 4,194,168 | A * | 3/1980 | Jarrett et al. ................... | 372/94 |
| 5,022,033 | A * | 6/1991 | Hackell ........................ | 372/25 |
| 5,170,409 | A | 12/1992 | Nightingale et al. | |
| 5,923,695 | A | 7/1999 | Patel et al. | |
| 6,289,031 | B1 | 9/2001 | Stultz et al. | |
| 6,654,392 | B1 * | 11/2003 | Arbore et al. ................. | 372/20 |
| 6,665,321 | B1 * | 12/2003 | Sochava et al. ............... | 372/20 |
| 6,845,121 | B1 * | 1/2005 | McDonald .................... | 372/34 |
| 6,940,880 | B1 * | 9/2005 | Butterworth et al. ......... | 372/22 |

FOREIGN PATENT DOCUMENTS

DE    40 41 130    7/1992

OTHER PUBLICATIONS

R. Paschotta et al.; Double-chirped semiconductor mirror for dispersion compensation in femtosecond lasers; Applied Physics Letters, American Institute of Physics, New York, vol. 75, No. 15, Oct. 11, 1999, pp. 2166-2168.

* cited by examiner

*Primary Examiner*—Minsun Oh Harvey
*Assistant Examiner*—Tuan N. Nguyen
(74) *Attorney, Agent, or Firm*—Black Lowe & Graham PLLC

(57) ABSTRACT

A rugged resonator for a laser includes a laser pump housing. An X-fold resonator assembly is configured to receive and hold the laser pump housing. The resonator includes at least four mirrors, a first, a second, a third, and a fourth mirror. The first mirror is configured to receive a first incident laser beam from the first end and to reflect a first reflected beam to reflect as a third reflected beam from the third mirror. The second mirror is configured to receive a second incident laser beam from the second end and reflecting a second reflected beam to intersect the first reflected beam and to reflect as a fourth reflected beam from the fourth mirror. An optical coupler is affixed to an optics plate and configured to receive the third reflected beam. A high reflector is affixed to the optics plate and configured to receive the fourth reflected beam.

39 Claims, 2 Drawing Sheets

OPTICAL BENCH FOR DIODE-PUMPED SOLID STATE LASERS IN FIELD APPLICATIONS

FIELD OF THE INVENTION

This invention relates generally to diode-pumped solid-state lasers and, more specifically, to optical benches for diode-pumped solid-state lasers.

BACKGROUND OF THE INVENTION

Laser-diode pumping is perhaps the most active area of current laser development. This technique, which uses semiconductor lasers to replace incoherent optical pump sources such as flash lamps or arc lamps, was responsible for a great deal of the renaissance of activity in solid state laser development that began in the mid-1980s. As diodes became less expensive, more powerful and longer lived, the development of this type of pumping has rapidly increased. Diode pumping allows a more compact laser system with reduced cooling and power consumption. In addition, the development of high-power laser diodes in the red and the infrared wavelength regions have allowed new laser materials to be directly diode pumped.

Many applications have benefited from the development of diode-pumped solid-state (DPSS) lasers. Commercial applications such as cutting and drilling have taken advantage of the longer lifetimes of diode-pumped lasers relative to lamp-pumped devices. Many military and aviation applications require "fieldable" devices, and the long life, compact package, and improved efficiency are strong factors that recommend these types of devices. Excellent examples of such structures are Ring Laser Gyroscopes (RLGs) and turbulence LIDARs, which must operate in extreme environments and are commonly used by space and aerospace companies.

DPSS lasers often have requirements that are conflicting such as resonator length requirements and compact packaging. To be "fieldable," lasers require good reproducible operation in varying environments. The varying environments can include high vibration, wide thermal swings, shock, and large variations in the input/output requirements. A highly stable mechanical structure that is relatively immune to the local environment such as vibration and thermal enhances reproducibility. Designed in self-compensation for resonator errors such as tilt or translations are highly desirable. Additionally, pumping the laser gain media longitudinally from both sides may be necessary to produce the desired gain from the gain media for a given application. For many laser systems, efficiency is critical and generally, the more efficiently the system performs, the more latitude the system exhibits in performance such as pulse rate and output energy. Low-emission cross-section laser materials amplify these requirements.

Lasers will have a finite bandwidth and a number of modes N within that bandwidth (both axial and transverse); the bandwidth and modes being a function of the resonator length and gain media. The larger a stable laser mode the greater the volume of (energy extraction that occurs within the laser gain medium (for a well mode-matched system). The each of the distinct transverse modes are denoted as $TEM_{mn}$, where m and n are integers designating which mode. $TEM_{00}$ designates the lowest order mode of a laser, with a Gaussian energy distribution across the beam.

Generally, it is very difficult to achieve a large stable laser mode size in a resonator that is well within the stable cavity criteria (i.e. the resonator stability coefficient $g_1g_2$ is between 0 and 1). One way that the mode can be made larger is by increasing the optical path length. Long optical path lengths, however, are contrary to compact laser systems, but folding the optical resonator with mirrors as internal optical cavity elements can accommodate this.

To create a useable laser mode within a resonator cavity, an optical assembly must rigidly control the location and tilt angles of the most sensitive optical elements, in particular intra-cavity mirrors. Failure to align such optics precisely will diminish the laser energy extraction by creating additional loss, preventing efficient output from the laser. Vibration and thermal swings add variability normally removed in the laboratory environment.

One approach to lengthening an optical cavity was to fold the cavity in a monolithic block structure. Monolithic blocks of low expansion material such as Zerodur™ made by Schott Glas, fused silica, BK-7™ or other glass-ceramic and glass materials have been found suitable to form the optical cavity. The cavity is formed by boring holes in the material to create a path that is optically continuous after the addition of optical mirrors thus producing a folded cavity. Because boring requires a cutter path from the outside of the block inward, designs have generally been limited to single and double folds.

DPSS lasers are often used in Q-switched designs for applications requiring a momentary emission at a high level rather than sustained stimulated emission with the same average power. Optical cavity length is also a key variable in Q-switched laser design. A Q-switched laser modulates the Q of the resonator by maintaining the Q of the cavity at a low value until the desired energy is stored in the laser host media. The Q of the cavity is then rapidly switched to a high value and the energy stored is then largely extracted. The shorter the cavity, the shorter the emitted Q-switch pulse. This scales roughly as the square root of the optical path length. Shorter optical pulses produce greater stress on the optical elements such as mirror coatings. For this reason, as well, longer optical lengths are desirable.

What is needed in the art, then, is a "fieldable" or rugged optical bench for a DPSS laser, having good stability for the optical components with a suitably long optical cavity.

SUMMARY OF THE INVENTION

A rugged resonator for a laser includes a laser pump housing. An X-fold resonator assembly is configured to receive and hold the laser pump housing. The resonator includes at least four mirrors, a first, a second, a third, and a fourth mirror, and an output coupler and a high reflector. A high reflector is affixed to the optics plate and the round trip starts from the high reflector then reflects off of top mirror, then to a lower mirror located across the assembly, then through the laser gain media. The trip continues to a symmetric lower mirror on the opposite side of the assembly, then reflects to the upper mirror on the opposite side of the assembly to the output coupler (An optical coupler is affixed to an optics plate). The remainder of the round trip occurs by retracing that optical path.

A preferred embodiment of the invention includes a four-fold self-compensating dual telescopic resonator in a highly stable mechanical block configuration and has a relatively low cost to produce. In a presently preferred embodiment, the optical coupler and high reflector are fastened to a common optics assembly plate and can be attached to each other such that they move in tandem. The optical coupler and the high reflector then have tilts that are similar to each other, but 180 degrees opposed. Consequently, the tilt errors nearly cancel out, allowing for greater than an order of magnitude reduction in tilt sensitivity compared to separate tilt errors. The location on a separate optical bench assembly reduces the probability of misalignment even further.

In accordance with further aspects of the invention, the optics assembly plate can include components such as a Brewster plate, Q-switch, polarizer, and additional external cavity turning optics. Placing all of the most sensitive components on a single well-controlled optics assembly plate allows operation under wide thermal environments and excellent operation under vibration since the plate material is mechanically stiff. Placing all of the most sensitive components on a single well-controlled optics assembly plate also allows for external alignment as a separate optical sub-assembly.

In accordance with other aspects of the invention, a dual telescopic resonator on the optics assembly plate produces a nearly collimated output beam and allows the beam diameter at the rear mirror and output coupler to be scaled as desired. With designed scaling, optical components requiring larger collimated beams can be inserted between optics on the plate. This is advantageous in cases where some optical components are operated near their optical damage threshold.

In accordance with further aspects of the invention, the placement of the optics assembly plate affixed to the X-fold resonator assembly allows excellent access to the optical gain media for longitudinal laser diode pumping. Such longitudinal laser pumping allows the mode volumes of both the laser pump and the laser mode to be well matched. Additionally, the placement of two separate pump optics assembly plate affixed to the X-fold resonator assembly allows longitudinally pumping of the optical gain media from both ends. Much as with the optics assembly plate, the configuration is a relatively symmetric system. The longitudinal pumping is also possible with only one pump assembly module. There is no requirement to limit operation to longitudinal pumping. Transverse pumping the gain media using laser diodes is also possible. The pump diodes are located in the pump housing with the diode output impinging on the laser gain media. This method removes the dichroic mirror-coating requirement on the lower mirrors allowing them to only be high reflectors at the laser-operating wavelength.

In accordance with still further aspects of the invention, the X-fold resonator assembly receives the optics assembly plate and additionally affixes the dichroic mirrors at designed tilt angles. Since the X-fold resonator assembly is nearly athermal, variations in reflective paths are more stable due to thermal isolation from the optics assembly plate and a laser pump housing. The X-fold resonator assembly is a monolithic block of any of suitable rigid low expansion materials such as Zerodur™, fused silica, BK-7™, or other glass-ceramic and glass materials, Invar or carbon fiber. The X-fold resonator is rugged, compact, stable, and relatively inexpensive to produce.

As will be readily appreciated from the foregoing summary, the invention provides a ruggedized laser resonator cavity that is inexpensive to produce and rigid to assure optimal laser gain with the resonator.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

By way of overview, a rugged resonator for a laser includes a laser pump housing. An X-fold resonator assembly is configured to receive and hold the laser pump housing. The resonator includes at least four mirrors, a first, a second, a third, and a fourth mirror and an output coupler and a high reflector. The high reflector is affixed to an optics plate. An optical path of a laser beam is round trip that starts by reflecting off of the third mirror, then to the first mirror located across the assembly, then through the laser gain media. The trip continues to a symmetrically placed second mirror on the opposite side of the assembly, and then reflects to the fourth mirror on the opposite side of the assembly to the output coupler (The optical coupler is affixed to the optics plate). The remainder of the round trip occurs by retracing that optical path.

Figure 1:
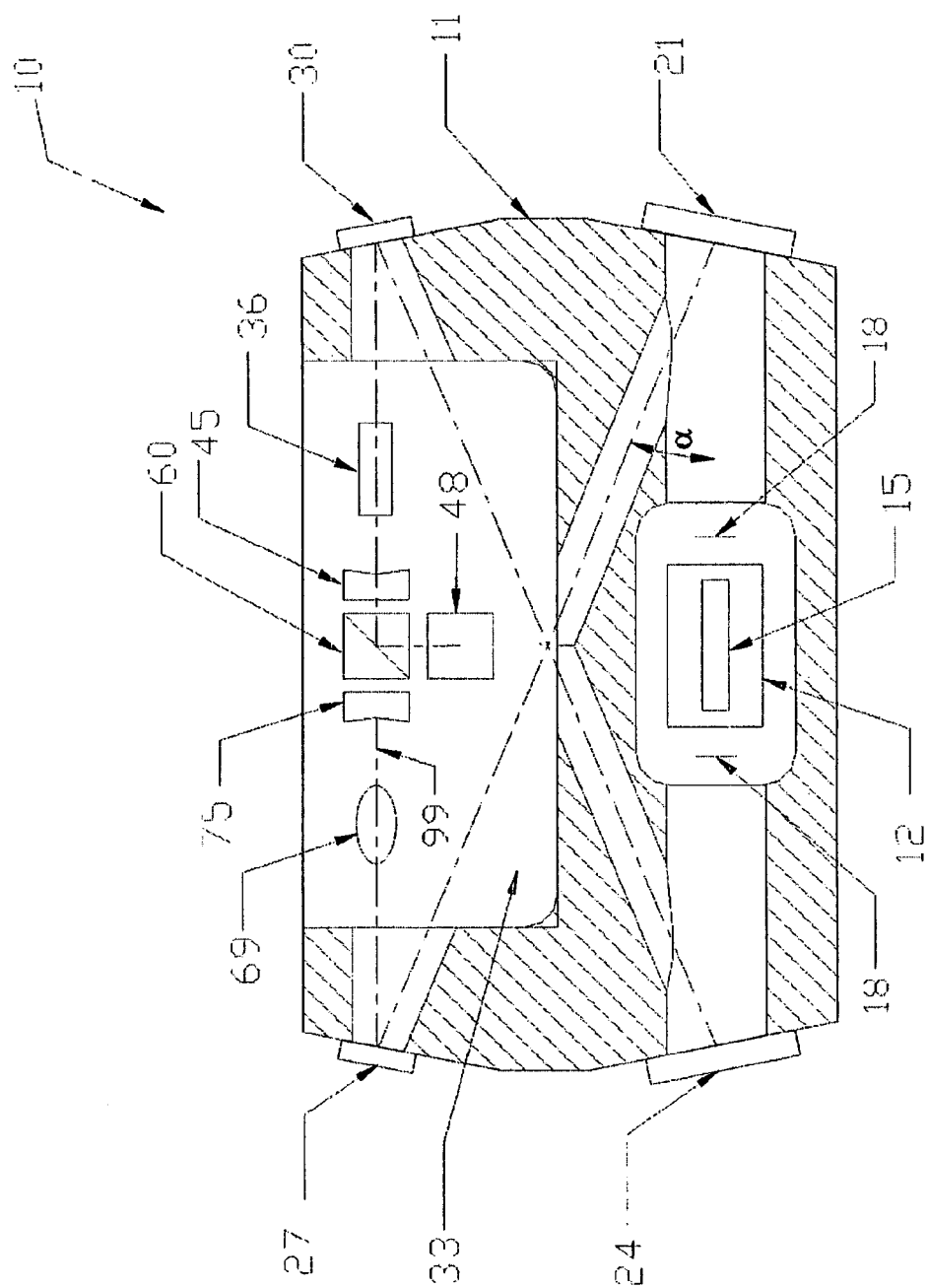
FIG. 1 is a cross-section of a laser resonator cavity formed in accordance with the present invention.

FIG. 1 is a cross-section of an X-fold optical resonator assembly 10. Referring to FIG. 1, one presently preferred geometry for the X-fold optical resonator assembly 10 is illustrated. The X-fold optical resonator assembly 10 includes three subassemblies: the X-fold optical bench sub-assembly 11, the laser pump housing 12, and the optics plate assembly 33. Both the laser pump housing 12, and the optics plate assembly 33 fit into recesses in the X-fold optical bench sub-assembly 11 making the X-fold optical bench sub-assembly 11 serve as a chassis for the X-fold optical resonator assembly 10.

The laser pump housing 12 contains a laser gain medium 15 located at the center of the laser pump housing 12. The laser pump housing 12 holds the laser gain medium 15 very nearly stress-free and can be advantageously constructed to conduct heat away from the laser gain medium 15. The laser gain medium 15 is generally a cylindrically shaped component, but can also be a slab. Longitudinal laser diode pumping with a heat sink around the laser gain media generally creates thermal distortion within the laser gain medium 15. A thermal gradient created within the laser gain medium 15 is the result of thermal expansion and temperature-induced refractive index variation. A radius of curvature (typically concave) may optionally be ground onto the optical faces of the laser gain medium 15 to produce a first order correction for any thermal lensing that occurs in the laser gain medium 15. The expected thermal lensing and additional radius of curvature are inputs into the resonator design.

Figuring corrective faces for laser gain medium 15 is readily accomplished. Numerous optical design programs can easily model resonator stability or the lens design can be hand calculated using the ABCD matrix approach. Important terms include optical component separation, optical component physical features such as refractive index and radius of curvature, desired wavelength of operation and properties of a laser gain media such as thermal lensing.

The laser pump housing 12 may optionally include a pair of quarter-wave plates 18 affixed in proximity to opposing ends of the laser gain medium 15. Quarter wave plates are commonly used to reduce the effects of spatial hole burning in single axial mode lasers. These are not required for lasers that are not single mode.

A laser beam 99 exploits a resonator by making a round trip propagation through the resonator. In a presently preferred embodiment, the laser beam 99 begins its round trip propagation at the high reflector 75 located on the optical assembly. The laser beam 99 enters the X-fold optical bench sub-assembly 11. The laser beam 99 then reflects off of mirror 27 and propagates down to mirror 21. The laser beam 99 then continues through the optical gain media 15 on to mirror 24. The laser beam 99 then continues on to mirror 30 and then to output coupler 45 located on the optical bench sub-assembly. Retracing the steps completes the round trip. In one preferred embodiment, the value of the output coupler reflectivity is essentially the same as the high reflector and the light is coupled out of the cavity by means of a polarization out-coupling. As its name implies, the X-fold optical bench sub-assembly 11 includes an X-shaped optical path for the laser beam 99 having parallel top and bottom paths and paths crossing at a center point. Mirrors define the optical path, specifically a first mirror 21, a second mirror 24, and a third mirror 27, and a fourth mirror 30.

The first mirror 21 and the second mirror 24 are located near the ends of the laser gain medium 15. The first mirror 21 and the second mirror 24 may advantageously be chosen to be dichroic, i.e. the mirrors are high reflectors at the laser emission wavelength, and high transmitters at the laser pump wavelength. Dichroic devices can be commercially purchased from such companies as VLOC (Port Richey, Fla.) with reflectivity of >99.99% at the lasing wavelength and transmissions generally >95% at the pump laser wavelength.

Broadband photo-pumping of ions, as from a flash lamp or other broadband source of photons, to create a population inversion is highly inefficient because only a small fraction of the energy emanates within the very narrow range of wavelengths near the resonant absorption frequency of the transition. On the other hand, where a laser diode of appropriate frequency emanates narrow band radiation at the absorption frequency of the transition, the stimulation is much more efficient.

The pumping diode assembly housings (not shown) are optionally located to align with the dichroic mirrors, the first mirror 21 and the second mirror 24. The pump laser diodes are selected to have photon output within a very narrow range of wavelengths near an absorption frequency of the transition of the laser gain medium 15. Advantageously, this is often a distinct frequency from the output of the laser gain medium 15 allowing the dichroic mirrors, first mirror 21 and a second mirror 24, to be suitably selected to pass waves at a pumping frequency while reflecting waves at the output frequency.

In one presently preferred embodiment, the pump laser diodes propagate into the resonator by means of a fiber port (not shown) and beam shaping optics (not shown). The photon output from the fiber port (not shown) and the beam shaping optics (not shown) are directed into the backside of the dichroic mirrors, the first mirror 21 and the second mirror 24. The beam then is admitted by either of the dichroic mirrors, the first mirror 21 and the second mirror 24, longitudinally along the path of the laser beam 99. Some fraction of the pump laser diodes is then absorbed by the laser gain medium 15, storing energy.

From the laser gain medium 15, the laser beam 99 travels along the optical path through a hole bored to accommodate the optical path in the X-fold optical bench sub-assembly 11 to either of the first mirror 21 and the second mirror 24 affixed to an outer surface of the X-fold optical bench sub-assembly 11. The first mirror 21 and the second mirror 24 may be chosen to have a positive radius of curvature such that they expand the laser mode that is incident on them coming from the laser gain medium 15. The first mirror 21 and the second mirror 24 where selected to be dichroic are further anti-reflection coated on their backside to increase laser pump transmission. Operation near normal incidence allows the mirror yield to be high. This is especially important for dichroic coatings where many properties are desired and small changes can dramatically affect the reflection and transmission characteristics.

The laser beam 99 from the first mirror 21 and the second mirror 24 will cross and continue onto the upper fold mirrors, the third mirror 27 and the fourth mirror 30. The third mirror 27 and the fourth mirror 30 are typically opposite in curvature direction from the lower fold mirrors and can essentially form the second optic of an optical telescope. Typically, the optical telescope can be achieved with magnification equaling the absolute values of the radius of curvature of the top mirror divided by the radius of curvature of the lower mirror, for instance, the second mirror 24 and the fourth mirror 30 respectively. Separations of the optics are critical and are set by a resonator designer.

An important dimension of X-fold optical bench sub-assembly 11 is an angle $\alpha$ where the laser beam 99 crosses itself at the center point. The angle $\alpha$ of the crossing requires consideration in that a mode of the laser beam 99 becomes more asymmetric with increasing tilt angle. If the angle $\alpha$ at crossing is kept below about 25 degrees, (twice that of the mirror tilt), then the resulting mode volume is not badly distorted and a good quality $TEM_{00}$ mode beam can be attained.

Lasing emission of coherent monochromatic photons occurs when the laser beam 99 has passed back and forth between the optical coupler 45 and the high reflector 75 many times in order to gain intensity by passing through the gain media. Where the optical path is a folded as in the X-fold optical bench sub-assembly 11, the optical coupler 45 and the high reflector 75 can be in close proximity on the optics plate assembly 33 in spite of being on opposite ends of the optical path. As configured in the presently preferred embodiment, the X-fold optical bench sub-assembly 11 with mode size changing optical elements enhances the self-compensating properties of the optics on the optics plate assembly 33.

The laser beam 99 that leaves the fourth mirror 30 goes to the optical coupler 45. The optical coupler 45 is design with transmission properties set by optical requirements of the application, as well as a curvature set by the resonator design. Generally, the curvature of the optical coupler 45 will be the same radius of curvature as the high reflector 75, but that is not a requirement. In fact, in some applications, the optical coupler 45 and the high reflector 75 may be equally reflective; the light is then coupled out of the resonator by means of a polarizing out-coupling. By affixing these two elements together and affixing them to the same optics plate assembly 33, thermal variation and mechanical vibration tend to cancel out. The optics plate assembly causes the optical coupler 45 and the high reflector 75 to move together tying them together such that they move as a unit reduces error. Consequently, the tilt errors nearly cancel out, allowing for greater than an order of magnitude reduction in tilt sensitivity compared to separate tilt errors.

Geometry of the presently preferred embodiment also allows excellent access to the optical gain medium 15 for longitudinal laser diode pumping along the optical path at the dichroic mirrors, the first mirror 21 and the second mirror 24. The pump volumes of the laser pump and the laser mode volume may be matched by optimizing the pump volume thereby assuring optimal pumping of the laser gain medium 15. Thus, the design of the X-fold optical bench sub-assembly 11 in the placement of the dichroic mirrors, the first mirror 21 and the second mirror 24 allows beams of light to longitudinally pump the optical gain media from both ends.

As well as the tilt misalignment self-compensation, the optics plate assembly 33 also accommodates the remainder of the most sensitive optical elements. The most sensitive optical elements are held on the optics plate assembly 33 in rigid fixation, controlling the location and tilt angles. Such sensitive optical elements might include, for example, beam modifying elements, such as a Brewster plate 69, a Q-switch 36, polarizer 60, and turning optics 48.

Figure 2:
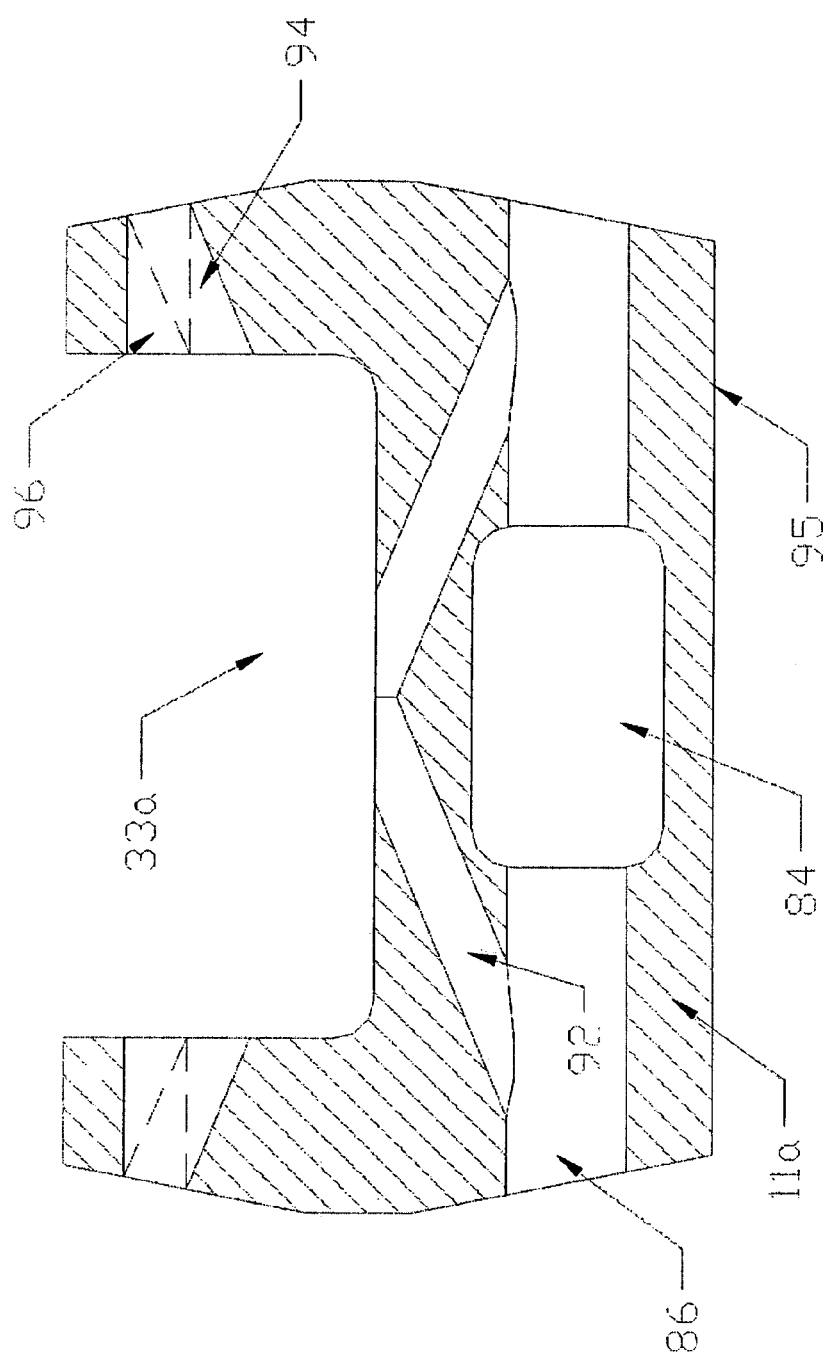
FIG. 2 is a cross-section of a monolithic block X-fold resonator in accordance with the present invention.

FIG. 2 is a cross-section of a monolithic block X-fold resonator. The X-fold optical bench sub-assembly 11 is fabricated from a monolithic block to assure homogeneity of thermal reaction and rigidity of the assembly. While production of highly stable optical and mechanical structures can be challenging, a number of processes can be performed in parallel creating a reproducible system using appropriate jigging. Tolerancing of the mechanical structure is within the fabrication capabilities of several large glass-ceramic machining houses such as Mindrum Precision and Ellis Ceramtek.

One advantage of the geometric configuration of X-fold optical bench sub-assembly 11 is the ability to bore the entirety of the optical path from outside surfaces. A laser pump housing receptacle 84 is easily cut into the X-fold optical bench sub-assembly 11 either before or after boring. To discuss the X-fold optical path, which is symmetric, it is only necessary to discuss a single side path from the laser pump housing receptacle 84 as the second path mirrors the first.

A first boring hole 86 establishes the entry into the X-fold optical bench sub-assembly 11 forming a receiving pocket for the second mirror 24. A single boring hole 86 may be advantageously used as an optical path for the laser beam 99 between the second mirror 24 and the laser pump housing receptacle 84. A diameter of the boring hole 86 is larger than a diameter of the laser beam 99 to allow for a pump beam diameter; the pump beam diameter being governed by the laser diode array characteristics. The bored holes are sized by the laser diode pump assemblies. These typically have much larger beam propagation diameters requiring larger initial entrance holes such as bored hole 86. There are many cases where the bored holes are not limited by the laser pumping and can be sized accordingly.

The optical bench sub assembly 11 has a peripheral surface 95 from which all boring advantageously originates. The peripheral surface 95 also defines an optics plate assembly receptacle 33a. From the first boring hole 86, the angle incident to the peripheral surface 95 of the optical bench sub-assembly 11 is shifted to accommodate the fourth boring hole 92, the optical path from the second mirror 24 to the fourth optical mirror 30. This boring hole might be advantageously bored in a single boring through the optics plate assembly receptacle 33a such that the boring would include the fifth boring hole 94. Alternatively, the fifth boring hole 94 might be bored from the site of the fourth optical mirror 30. A final sixth boring hole 96 completes the optical path through the X-fold optical bench sub-assembly 11 terminating in the optics plate assembly receptacle 33a. Fastener holes are suitably drilled to complete the machining of the X-fold optical bench sub-assembly 11.

The selection of a material for the monolithic X-fold optical bench sub-assembly 11 is varied as none of the material is involved in the optical path, rather the X-fold optical bench sub-assembly 11 holds optical elements in place within the optical path. Zerodur™, fused silica, or BK-7™ blocks have both proved workable though other low-expansion materials with a high stiffness would work as well.

Mirrors, specifically the first mirror 21, the second mirror 24, the third mirror 27, and the fourth mirror 30, can be attached and aligned by any of several alternate methods. Such methods include optical contacting, metal seals, glass flits, adhesives or carriers. Mirrors may be attached the X-fold optical bench sub-assembly 11 by optical contacting. Optical contacting requires very good localized polishing (on the order of a few angstroms rms) for attachment on the peripheral surface 95.

An alternative attachment method is to frit bond the mirrors to the blocks. Frit bonding is accomplished using a low temperature glass frit that is applied to the uncoated mirror surface near the edge of the mirror and block. The X-fold optical bench sub-assembly 11 is heated to specified temperatures that do not compromise the mirror, coating integrity or frame integrity for specific thermal profiles and times so that the frit vehicle burns out and the frit melts then solidifies holding the optic.

While the preferred embodiment of the invention has been illustrated and described, as noted above, many changes can be made without departing from the spirit and scope of the invention. For example, the precise dimensions of the X-fold optical resonator assembly 10 may be varied according to the laser gain medium 15 selected for a particular application. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A rugged resonator for a laser, the resonator comprising:
   a laser pump housing assembly, the laser pump housing assembly including:
      a laser pump housing; and
      a laser gain medium suitably mounted into or on the laser pump housing, the laser gain medium having a first and a second end;
   a resonator assembly, the resonator assembly configured to receive and hold the laser pump housing, the resonator including:
      at least four mirrors, a first, a second, a third, and a fourth mirror, the first mirror being configured to receive a first incident laser beam from the first end and to reflect a first reflected beam to strike the third mirror, the second mirror configured to receive a second incident laser beam from the second end and to reflect a second reflected beam to pass in proximity to the first reflected beam and to strike the fourth mirror; and
   an intra-cavity optics plate assembly, the plate including:
      an intra-cavity optics plate;
      an output coupler, affixed to the optics plate and configured to receive a laser beam reflected by the fourth mirror; and a high reflector, affixed to the optics plate and configured to receive a laser beam reflected by the third mirror.

2. The resonator for a laser of claim 1, wherein the first reflected beam intersects the second reflected beam.

3. The resonator for a laser of claim 1, wherein the intra-cavity optics plate includes a mechanical coupling between the optical coupler and the high reflector.

4. The resonator for a laser of claim 1 further comprising an etalon affixed to the optics plate and configured to intercept the third reflected beam.

5. The resonator for a laser of claim 1 further comprising a Brewster plate affixed to the optics plate and configured to intercept the third reflected beam.

6. The resonator for a laser of claim 1 further comprising turning optics affixed to the optics plate and configured to intercept the fourth reflected beam.

7. The resonator for a laser of claim 1, wherein at least one of the mirrors is configured to admit a pumping radiation.

8. The resonator for a laser of claim 1, wherein the resonator assembly further includes an X-fold housing configured to receive and hold the mirrors in fixed relation.

9. The resonator for a laser of claim 8, wherein the housing includes a monolithic block of material.

10. The resonator for a laser of claim 9, wherein the material is a low expansion material.

11. The resonator for a laser of claim 10, wherein the material is a glass ceramic.

12. The resonator for a laser of claim 1, wherein the material is selected from a group consisting of Zerodur, BK-7, and fused silica.

13. The resonator for a laser of claim 1, wherein the resonator is further configured for use in a lidar.

14. The resonator for a laser of claim 13, wherein the Lidar is a part of a clear air turbulence indication system.

15. The resonator for a laser of claim 1, wherein the resonator is further configured for use in a target illumination laser.

16. An X-fold resonator assembly, the resonator assembly configured to receive and hold the laser pump housing including a laser gain medium having a first and a second end, the X-fold and further configured to receive and hold an optics plate assembly, the resonator assembly including:
   a first mirror, the first mirror being configured to reflect a first laser beam from the first end;
   a second mirror, the second mirror being configured to reflect a second laser beam from the second end to intersect the first laser beam:
   a third mirror, and the third mirror being configured to reflect the first laser beam from the first mirror to the optics plate assembly; and
   a fourth mirror, and the fourth mirror being configured to reflect the second beam from the second mirror and to the optics plate assembly.

17. The X-fold resonator assembly of claim 16, wherein the X-fold resonator assembly further includes an X-fold housing configured to receive and hold the mirrors in fixed relation.

18. The X-fold resonator assembly of claim 16, wherein the X-fold housing includes a monolithic block of material.

19. The X-fold resonator assembly of claim 16, wherein the X-fold housing includes fused materials.

20. The X-fold resonator assembly of claim 16, wherein the material is a low expansion material.

21. The X-fold resonator assembly of claim 16, wherein the material is a glass ceramic.

22. The X-fold resonator assembly of claim 16, wherein the material is selected from a group consisting of Zerodur, BK-7 and fused silica.

23. The X-fold resonator assembly of claim 16, wherein at least one of the mirrors is configured to admit a pumping radiation.

24. The X-fold resonator assembly of claim 16, wherein the laser pump housing is configured to admit a pumping radiation.

25. A method for resonating a beam from a laser gain medium, the method comprising:
   receiving a first beam from a first end of the laser gain medium, the receiving a first beam including:
      reflecting the first beam from a first mirror to a second mirror;
      reflecting the first beam from the second mirror to a high reflector; and
   receiving a second beam from a second end of the laser gain medium, the receiving the second beam including:
      reflecting the second beam from a third mirror to a fourth mirror, the second beam intersecting the first beam between the first and second mirrors; and
      reflecting the second beam from the fourth mirror to a optical coupler.

26. The method of claim 25, wherein the high reflector and the optical coupler are mechanically coupled.

27. The method of claim 26, further comprising:
   directing the output of the optical coupler to a LIDAR transceiver section.

28. The method of claim 26, further comprising:
   directing the output of the optical coupler to a clear air turbulence indicator.

29. The method of claim 26, further comprising:
   directing the output of the optical coupler to a target illumination system.

30. The method of claim 26, further comprising:
   receiving a pumping radiation at the first mirror, the first mirror being configured to admit a pumping radiation.

31. The method of claim 26, further comprising:
   receiving a pumping radiation at the second mirror, the second mirror being configured to admit a pumping radiation.

32. The method of claim 26, further comprising:
   receiving a pumping radiation at the third mirror, the third mirror being configured to admit a pumping radiation.

33. The method of claim 26, further comprising:
   receiving a pumping radiation at the fourth mirror, the fourth mirror being configured to admit a pumping radiation.

34. The method of claim 25, wherein the high reflector and the optical coupler are mechanically coupled to precision optical components.

35. The method of claim 34, wherein the precision optical components includes a porro prism.

36. The method of claim 34, wherein the precision optical components includes a Brewster plate.

37. The method of claim 34, wherein the precision optical components includes a quarter-wavelength plate.

38. The method of claim 34, wherein the precision optical components includes a half-wavelength plate.

39. The method of claim 34, wherein the precision optical components includes a polarizer.

* * * * *